US005652542A

United States Patent [19]
Fink

[11] Patent Number: 5,652,542
[45] Date of Patent: Jul. 29, 1997

[54] DIGITAL SIGNAL PROCESSOR FOR AMPLIFIER

[75] Inventor: Dennis Fink, Warwick, N.Y.

[73] Assignee: Crest Audio, Inc., Paramus, N.J.

[21] Appl. No.: 546,839

[22] Filed: Oct. 23, 1995

Related U.S. Application Data

[63] Continuation of Ser. No. 336,481, Nov. 9, 1994, abandoned

[51] Int. Cl.$^6$ ............................................ H03F 21/00
[52] U.S. Cl. ............................................ 330/2; 381/120
[58] Field of Search ............................ 330/2, 65; 381/100, 381/120, 121

[56] References Cited

U.S. PATENT DOCUMENTS

| | | | |
|---|---|---|---|
| 3,769,606 | 10/1973 | Henegar | 330/66 |
| 3,974,438 | 8/1976 | Alves, III | 323/9 |
| 4,000,475 | 12/1976 | Oiwa | 330/66 |
| 4,079,334 | 3/1978 | Hamilton | 330/279 |
| 4,223,272 | 9/1980 | Feistel | 330/51 |
| 4,335,384 | 6/1982 | Roos | 330/2 X |
| 4,494,212 | 1/1985 | Muellner | 364/571 |
| 4,510,454 | 4/1985 | Sherman | 330/2 |
| 4,547,740 | 10/1985 | Nilsson | 330/2 |
| 4,556,841 | 12/1985 | Carlson | 330/2 X |
| 4,785,419 | 11/1988 | Huffman | 330/2 X |
| 4,868,516 | 9/1989 | Henderson et al. | 330/86 |
| 4,924,192 | 5/1990 | Sasaki | 330/279 |
| 4,987,385 | 1/1991 | Engelmann | 330/297 |
| 4,991,221 | 2/1991 | Rush | 381/120 |
| 5,006,812 | 4/1991 | Erickson | 330/2 |
| 5,015,969 | 5/1991 | Barclay et al. | 330/284 |
| 5,059,923 | 10/1991 | Petty et al. | 330/273 |
| 5,065,802 | 11/1991 | Miyake et al. | 330/2 |
| 5,127,059 | 6/1992 | Elion et al. | 381/120 |
| 5,153,528 | 10/1992 | Back | 330/254 |
| 5,285,500 | 2/1994 | Mantz | 381/86 |
| 5,313,524 | 5/1994 | Van Hulle et al. | 381/120 X |
| 5,339,362 | 8/1994 | Harris | 381/86 |

FOREIGN PATENT DOCUMENTS 54-10648  1/1979  Japan.

*Primary Examiner*—Steven Mottola
*Attorney, Agent, or Firm*—Ostrolenk, Faber, Gerb & Soffen, LLP

[57] ABSTRACT

An amplifier has a digital signal processor for receiving input digital or analog audio signals for modification by at least one of a plurality of signal processing functions and corresponding signal processing function parameters. The digital signal processor receives input control signals for changing the signal processing function and signal processing function parameters. The amplifier also includes a detecting device for directly monitoring performance of the amplifier and a detecting device for monitoring a current and voltage of a signal output from the amplifier. The digital signal processor monitors the detected amplifier performance, current and voltage and automatically controls the signal processing functions and parameters, as well as amplifier circuits, to make any necessary modifications to the signal output from the amplifier.

13 Claims, 2 Drawing Sheets

DIGITAL SIGNAL PROCESSOR FOR AMPLIFIER

This is a continuation of application Ser. No. 08/336,481, filed on Nov. 9, 1994 abandoned.

BACKGROUND OF THE INVENTION

The present invention relates to a digital signal processor located within an amplifier, and more particularly, to a digital signal processor provided in a signal path of an amplifier for programming both signal processing functions and associated signal processing function parameters according to signals input to the digital signal processor.

BACKGROUND OF THE ART

Conventional amplifiers, such as the amplifier 10 shown in FIG. 3, typically have a signal path including an input port 12, a signal processing circuit 14, a power amplifier 16 and an output port 18 connected to a load such as a loudspeaker 20. The signal processing circuit 14 and power amplifier 16 form an integral unit as seen in FIG. 3. The signal processing circuit 14 includes various analog and/or digital components such as resistors, capacitors, switches and other electronic devices that together define a signal processing function.

The signal processing function may be a crossover function in which audio-frequency input to the signal processing circuit is divided into two or more bands of frequencies. Typically, a high frequency band is separated from a low frequency band so that the high frequency band can be sent to a tweeter of the loudspeaker and the low frequency band can be sent to the woofer of the loudspeaker. Other functions defined by the signal processing circuit components may include a band splitting or eliminating function, a volume control function, an equalizing function, a frequency division function, a limiter or compression function, a microphone or line level mixer, an ambient sense level control function and any other suitable function.

Using the example of a crossover function discussed above, the signal processing circuit 14 defines both the signal processing function (crossover), as well as, signal processing function parameters, such as a crossover frequency and amplitude. More specifically, the various signal processing circuit elements define the exact amplitude and frequency that determines how to divide the audio-frequency input into the high frequency band and the low frequency band.

Conventional signal processing circuits 14 are usually comprised of analog and digital components on a printed circuit board. The signal processing function parameters, such as a crossover frequency and amplitude, can be changed by adjusting control knobs 22 provided on an amplifier housing (not shown) and operatively connected to the components of the signal processing circuit. Alternatively, the signal processing function parameters may be modified by signals input via a program bus 24 from a network (not shown) of a plurality of interconnected amplifiers controlled by a computer or similar device.

However, with this amplifier 10, the signal processing function is fixed by the circuit design of the signal processing circuit and cannot be easily changed. Although the user can change the signal processing function parameters as described above, it is often necessary or desirable to change the signal processing function or even combine several different signal processing functions in the signal processing circuit. This is not possible with conventional amplifiers.

Another embodiment of a conventional amplifier system 40 is shown in FIG. 4 wherein like reference numerals indicate like elements to avoid repetition. In this type of amplifier system, the power amplifier 16 and signal processing circuit 14 do not form an integral unit as in the amplifier 10 of FIG. 3 but instead are separate units that are interconnected. The signal processing circuit 14 in this type of amplifier system 40 is a dedicated function unit that cannot be modified without removing and/or replacing the signal processing circuit elements. Thus, the signal processing function and associated parameters in this amplifier system cannot be changed.

Although it is possible to change the signal processing function and associated parameters of the amplifier system 40 and amplifier 10 by removing and modifying the signal processing circuit, this requires a great deal of time and effort and additional signal processing components. Also, the modification, removal and/or replacement of the various signal processing circuit elements is time consuming and difficult because the signal processing circuit elements are typically plug-in or solderable components.

SUMMARY OF THE INVENTION

There exists a need for an improved amplifier signal processing circuit capable of modifying both signal processing functions and signal processing function parameters.

A preferred embodiment of the present invention provides an amplifier having a digital signal processor for selectively programming signal processing functions and signal processing function parameters. The digital signal processor is preferably provided in a module which includes a plurality of input ports for receiving input control signals and/or input audio signals from various input devices for changing at least one of the signal processing functions and the signal processing function parameters.

In an alternative embodiment, a single input port can be used to transmit both audio signals and control signals over the same line. Thus, digital or analog audio signals and digital control signals for downloading to the digital signal processor a program defining a signal processing function and parameters can be received through a single input port provided on the digital signal processor.

The digital signal processing module is preferably mounted on an amplifier chassis within an amplifier housing. The digital signal processor module preferably may contain both analog and digital signal input connectors for receiving either analog or digital audio signals. An analog/digital converter is preferably provided in the module and connected to the analog signal input to convert the analog audio signals to digital audio signals to be processed in the digital signal processor.

The module preferably may include another input port such as a bus connected to a network of interconnected amplifiers for receiving control signals from the network. The network is connected to a computer or other similar device which is used for entering control signals and transmitting the control signals over the network to the various amplifiers of the network. The control signals define functions and/or function parameters for each of the plurality of amplifiers connected to the network.

The digital signal processing module also preferably includes a programming port for being removably connected to a portable amplifier programmer described in U.S. patent application Ser. No. 08/558,344 which is a continuation application of U.S. patent application Ser. No. 08337,157, entitled "APPARATUS AND METHOD FOR PROGRAMMING AN AMPLIFIER," filed on Nov. 9, 1994 in the name of the same Applicant as in the present application, the disclosure of which is hereby incorporated by reference. The portable programmer inputs command signals for changing at least one of the signal processing functions and corresponding function parameters according to information input to the portable programmer.

The digital signal processor preferably includes a non-volatile storage device or memory for storing the programs and program data that define the signal processing functions and function parameters. The non-volatility of the storage device allows the signal processing functions and parameters to be unaffected by connecting and disconnecting a power source to the amplifier.

A controller, preferably in the form of a microprocessor, is provided in the digital signal processor for processing the control signals for modifying signal processing programs and coefficients to modify the functions and function parameters defined by the program. The control signals are input from the network bus and portable programmer to the digital signal processor. The control signals define the programs and coefficients for setting the signal processing functions and parameters in the digital signal processor. The controller may also be programmed to compute parameters for the digital signal processor based on command signals input from the network or the portable programmer.

The digital signal processor according to the preferred embodiment of the invention may include at least one of a voltage measuring device and a current measuring device for measuring the voltage and current in the signal path. This information can be converted from analog to digital and fed back to the digital signal processor. The digital signal processor uses the current and voltage information to calculate a load impedance and an amount of power supplied from the amplifier to the load as described in U.S. patent application Ser. No. 08/558,386 which is a continuation application of U.S. patent application Ser. No. 08/336,828, entitled INTERNAL LOAD MONITOR FOR AMPLIFIER, filed on Nov. 9, 1994 in the name of the same Applicant as in the present application, the disclosure of which is hereby incorporated by reference. This allows the digital signal processor to perform a diagnostic function to ensure that a load or each of a plurality of loads are operating correctly. If a load is malfunctioning or not receiving power, the digital signal processor can determine this based on the load impedance and power supplied to the load which is calculated from the voltage and current detected in the signal path. This diagnostic function is particularly important in emergency announcing systems having a plurality of loudspeakers and in systems where loudspeakers are remotely located and not easily tested for proper functioning. Also, the digital signal processor can determine from the calculated power that the amplifier is delivering too much power and send a control signal to the amplifier to reduce the amount of power thereby preventing damage to the amplifier.

The preferred embodiment of the present invention provides significant improvements and advantages because it allows one or more signal processing functions and signal processing function parameters to be easily and quickly programmed. Also, because the digital signal processor is programmable, the signal processing functions and parameters can be changed any number of times by simply inputting new parameters or downloading a new program. The functions and parameters are stored in a non-volatile memory in the digital signal processor so that the programmed functions and parameters are unaffected by turning on and off the amplifier. In addition, the digital signal processor according to the preferred embodiment of the present invention allows for several different input devices to be used to input either digital or analog audio signals and/or control signals to selectively modify at least one of a plurality of signal processing functions and signal processing function parameters.

Further, the digital signal processor allows the signal processing functions to be combined as desired. Also, because the digital signal processor can change a function or parameter in real time while the amplifier is operating, a user can hear the difference in sound produced by a load such as a loudspeaker to determine if the change to the function or parameter is acceptable.

In addition, the digital signal processor of the preferred embodiment can monitor load performance for a plurality of amplifiers to perform diagnostic functions. Also, the location of the digital signal processor in the amplifier allows for the implementation of distributed system performance such as array steering and acoustic zone control. Further, adaptive algorithms and linear-phase all-zero filters can be implemented.

Other features and advantages of the present invention will become apparent from the following description of the invention which refers to the accompanying drawings.

DETAILED DESCRIPTION OF A PREFERRED EMBODIMENT

Figure 1:
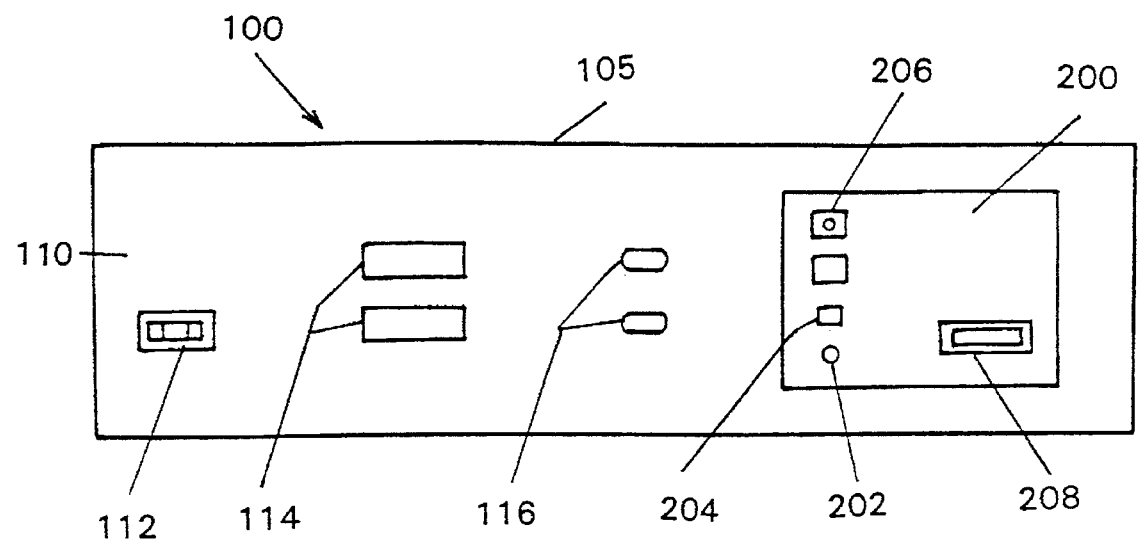
FIG. 1 shows a schematic view of an amplifier according to a preferred embodiment of the present invention.

An amplifier 100 according to a preferred embodiment of the present invention is shown in FIG. 1 and includes an amplifier housing 105. The amplifier housing 105 contains an amplifier control panel 110 which has an AC power connector 112, a plurality of output ports 114 and a plurality of conventional control knobs 116 for controlling volume and gain, for example. The control panel 110 also includes a digital signal processor module 200.

The digital signal processor module 200 includes a plurality of input ports including a digital signal input port 202 and an analog signal input port 204 for receiving input audio signals. A network bus input port 206 is also provided on the module 200 for receiving input digital audio signals and/or input digital control signals from a network of interconnected amplifiers. Also, a portable programmer input port 208 is provided on the module 200 for being removably connected to and receiving digital control signals from a portable programmer described in U.S. patent application Ser. No. 08/558,344 referred to above.

Figure 2:
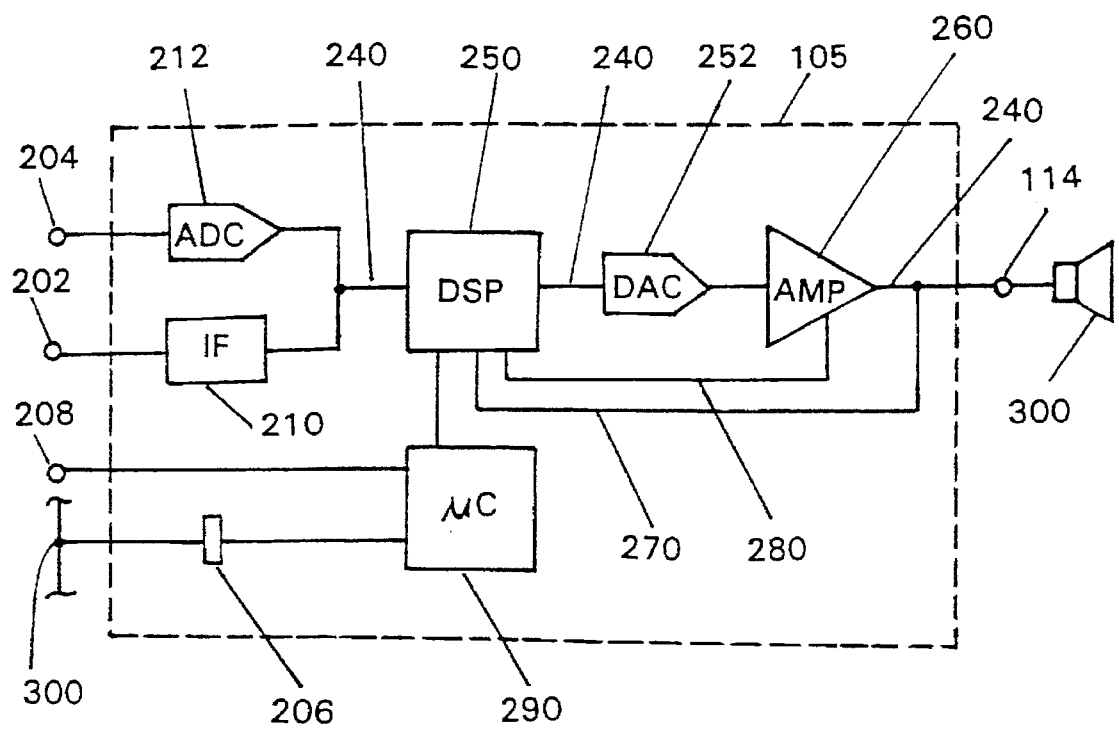
FIG. 2 is a schematic view of a digital signal processing circuit for the amplifier of FIG. 1.
Figure 3:
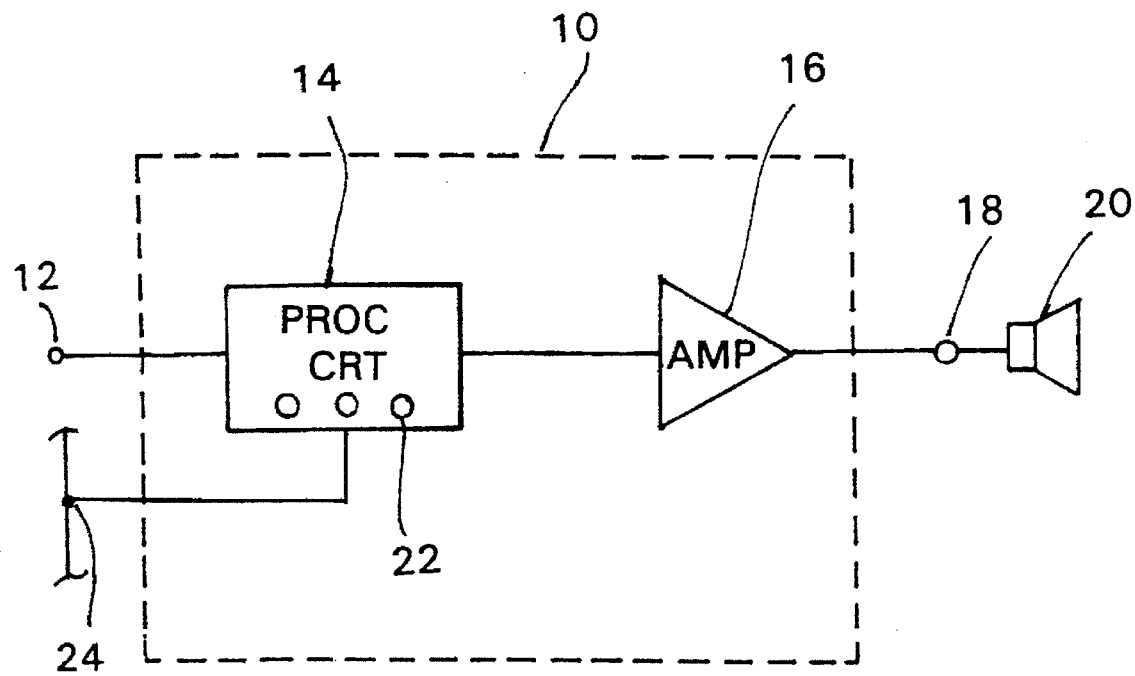
FIG. 3 is a schematic view of a conventional amplifier having an integral signal processing circuit and power amplifier.
Figure 4:
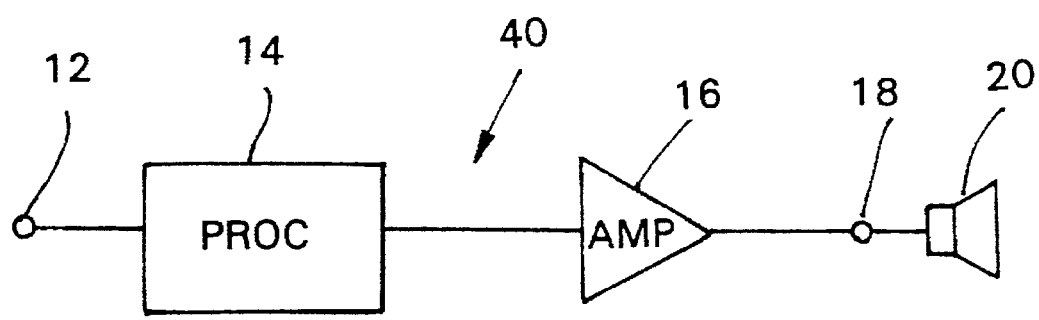
FIG. 4 is a schematic view of another conventional amplifier having a dedicated function signal processing circuit.

The signal path for the digital signal processor module 200 and the amplifier 100 is more clearly shown in FIG. 2.

The amplifier input port 202 can be connected to an analog signal input port such as a musical instrument, etc. for receiving analog audio signals. The amplifier input port 204 can be connected to a digital input device such as a sound mixing board, etc. for receiving input digital audio signals. Also, a computer connected to a network can be connected to the network bus 300 to input digital control signals. Each of the input devices discussed above can be connected to the digital signal processing module 200 simultaneously. The output port 114 is connected to a load such as a loudspeaker 300.

The digital signal processor module 200 includes a digital signal processor 250 connected in the amplifier main signal path 240 shown in FIG. 2. The signal path 240 is connected to a digital signal interface 210 connected between the digital signal input port 202 on the digital signal processor module 200 and the digital signal processor 250 for transmitting the input digital audio signals to the processor 250. An analog/digital converter 212 is provided between the analog signal input port 204 and the digital signal processor 250 for converting input analog audio signals to digital signals.

A controller preferably in the form of a microprocessor 290 is provided in the amplifier. The microprocessor 290 performs a control function for downloading signal processing control and program signals input via the input port 206 from the network bus 300 and the portable programmer input through the programmer port 208. The control signals input from the ports 206 and 208 define a program and program data that sets the signal processing functions and function parameters. The microprocessor 290 gathers control signals and/or signal processing programs to be loaded into the digital signal processor 250. The microprocessor 290 may also be programmed to compute parameters for the digital signal processor 250 based on commands input from the programmer or network.

The main signal path 240 also includes a digital/analog converter 252 for converting the digital control signals from the digital signal processor 250 to analog signals to be input to a power amplifier 260. The analog signals received from the digital/analog converter 252 are amplified by the performance of the power amplifier 260 in a desired manner.

The main signal path 240 is connected to at least two additional signal paths 270, 280 for detecting load characteristics and monitoring and controlling amplifier performance, respectively. More specifically, the power supply control signal path 280 is connected between the power amplifier 260 and the digital signal processor 250 and includes a digital/analog converter and an analog/digital converter (not shown) for allowing transfer of signals therebetween. Through the power supply control signal path 280, the digital signal processor 250 can receive and monitor the performance characteristics of the power amplifier 260. If the performance characteristics of the amplifier 260 are unacceptable, the digital signal processor 250 can send a control signal via the signal path 280 for modifying the amplifier performance. The digital signal processor may control power supply or amplifier circuit functions based on input audio signals and amplifier power and distortion levels to prevent damage to the amplifier 260 and the load 300 and to increase the performance efficiency of the amplifier 100.

The signal path 270 includes a current detector and a voltage detector (not shown) described in U.S. patent application Ser. No. 08/558,386, described above. The current detector and voltage detector detect a current and voltage sent through the amplifier 260. The detected current and voltage are sent via the signal path 270 to the digital signal processor 250 where an impedance of the load 300 and an amount of power supplied to the load 300 by the amplifier 260 is calculated. The digital signal processor 250 can then monitor the load impedance and power supply as a safety and diagnostic function to prevent malfunction of and damage to the load 300 or the amplifier 260.

Digital signal processor 250 is programmable and performs a signal processing operation for amplifying or modifying the characteristics of an input audio signal to produce a modified output signal. The digital signal processor 250 is capable of receiving and storing an algorithm or program that defines a signal processing function and/or corresponding function parameters. In addition, the digital signal processor 250 is adapted to receive control signals for modifying the signal processing function and associated parameters. Because the digital signal processor 250 is a programmable device, an increased flexibility in signal processing is possible. More specifically, several different signal processing functions can be combined and modified by simply inputting appropriate control signals to the digital signal processor 250. This allows the amplifier to implement such advantageous features as distributed system performance including array steering and acoustic zone control, as well as, using adaptive algorithms and linear-phase, all-zero filters and amplifier power dissipation controls.

The digital signal processor 250 preferably has a non-volatile storage device for storing input programs, program data and control signals. The non-volatility prevents the programs and data from being erased upon disconnection of a power source from the amplifier 100. Also, because the digital signal processor 250 is programmable and has a non-volatile storage device, a new signal processing function program can be input and stored as desired.

Typically, the control signals input to the digital signal processor 250 comprise information for modifying the signal processing function defined by the program stored in the digital signal processor 250. Then additional control signals for defining the parameters of the newly defined signal processing functions are input to the digital signal processor 250.

The operation of the amplifier 100 having the digital signal processor 250 is described in the following paragraphs. Input audio or input control signals are received in the amplifier 100 via one or more of the analog input port 204, the digital input port 202, the signal programmer port 208 and the network bus 300 and input port 206. The signals received from the analog signal input port 204 and the digital signal input port 202 are audio signals. The signals received from the analog signal input port 204 are converted to digital signals by the converter 212. The signals received from the digital signal input port 202 are transmitted to the digital signal processor 250 via the signal interface 210.

The signals received from the network bus 300 and the signal programming port 208 are control signals. The control signals include audio signal processing programs and program data for defining the signal processing function and parameters of the amplifier 100.

The control signals received from the network bus 300 and the signal programming port 208 are input to the microprocessor 290. The microprocessor 260 then downloads the control signals to the digital signal processor 290 by digital data transfer in either the serial or parallel form. The microprocessor 250 may transfer programs in a form executable by the digital signal processor 250 or may transfer coefficients and data to be used by the program stored in the digital signal processor 250 in executing the signal processing function or functions. The microprocessor 290 may have its own program for computing data and coefficients based on information passed to it over the network bus 300 or programmer port 208 or it may simply pass on data that is readily usable by the digital signal processor 250.

The control signals received in the digital signal processor 250 from the microprocessor 290 modify and/or combine at least one of a plurality of signal processing control functions and change the corresponding function parameters, as desired. This is achieved in the digital signal processor 250 by executing the newly downloaded program stored in the digital signal processor program memory or by using parameters downloaded to data memory.

Thus, when digital audio signals are input to the digital signal processor 250, the audio signals are modified in accordance with the signal processing functions and parameters set by the control signals input to the digital signal processor 250 from the microprocessor 290. The digital audio signals are then output from the digital signal processor 250 and are converted to analog signals by the converter 252 and then sent to the power amplifier 260 and then to the loudspeaker 300.

The amplifier performance is monitored by the signal path 280 to provide an additional control over the performance of the power amplifier 260 as described above. For example, the digital signal processor 250 may switch or modulate the power supply voltages to improve amplifier efficiency and sonic quality.

The signal path 270 monitors and detects the voltage and current of the signal output from the amplifier 260 and inputs the detected voltage and current values to the digital signal processor 250 which calculates the load impedance and power supplied to the load 300. The digital signal processor 250 can automatically control signal processing functions and parameters in response to the calculated load impedance and power supply.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An amplifier comprising:

a power amplifier; and a digital signal processor capable of receiving and storing at least one of an algorithm which defines at least one signal processing function and signal processing function parameters, the digital signal processor being connected to the power amplifier and having a first input for receiving at least one of the algorithm and signal processing function parameters and an input/output port for receiving performance characteristics of the power amplifier and for transmitting control signals for modifying the performance of the power amplifier.

2. The amplifier of claim 1, wherein the digital signal processor comprises a non-volatile memory for storing at least one algorithm therein.

3. The amplifier of claim 1, wherein the digital signal processor comprises a second input for receiving audio signals from at least one of a digital audio signal input port and a first analog to digital converter and an output for outputting audio signals to the power amplifier.

4. The amplifier of claim 1, wherein the input/output port of the digital signal processor is operatively connected to a first digital to analog converter for transmitting the control signals for modifying the performance of the power amplifier and a second analog to digital converter for receiving the performance characteristics of the power amplifier.

5. An amplifier comprising:

a power amplifier; and a digital signal processor capable of receiving and storing at least one of an algorithm which defines at least one signal processing function and signal processing function parameters, the digital signal processor being connected to the power amplifier;

a current detector for detecting current delivered to a load from the power amplifier and a voltage detector for detecting the voltage supplied to the load from the power amplifier, wherein the digital signal processor further comprises an input port for receiving the detected current and voltage, and wherein the current detector and voltage detector are operatively connected to the power amplifier and the digital signal processor, and wherein the digital signal processor calculates the impedance of the load.

6. The amplifier of claim 1, further comprising a controller for receiving the algorithm and the signal processing function parameters and transmitting the algorithm and the signal processing function parameters to the digital signal processor.

7. The amplifier of claim 6, wherein the controller comprises a programmable microprocessor for receiving at least one of the algorithm and the signal processing function parameters to be transmitted to the digital signal processor.

8. The amplifier of claim 7, wherein the programmable microprocessor has a program for computing the signal processing function parameters based on input control signals and transmitting the signal processing function parameters to the digital signal processor.

9. The amplifier of claim 8, further comprising a network bus input port and a portable programmer input port each being connected to the programmable microprocessor for receiving at least one of the input control signals, the alogrithm and the signal processing function parameters into the programmable microprocessor.

10. The amplifier of claim 1, wherein the digital signal processor comprises an input operatively coupled to at least one of an analog audio signal input port, a digital audio signal input port, a portable programmer port and a network bus port.

11. The amplifier of claim 1, wherein said digital signal processor receives and stores at least one signal processing function from the group consisting of: a crossover function; a band splitting function; a volume control function; an equalizing function; a frequency division function; a limiter function; a compression function; a microphone mixer function; a line mixer function; and an ambient sense level control function.

12. The amplifier of claim 1, wherein said digital signal processor receives and stores a combination of at least two signal processing functions from the group consisting of: a crossover function; a band splitting function; a volume control function; an equalizing function; a frequency division function; a limiter function; a compression function; a microphone mixer function; a line mixer function; and an ambient sense level control function.

13. An amplifier comprising:

a power amplifier; and a digital signal processor capable of receiving and storing at least one of an algorithm which defines at least one signal processing function and signal processing function parameters, the digital signal processor being connected to the power amplifier;

a current detector for detecting current delivered to a load from the power amplifier and a voltage detector for detecting the voltage supplied to the load from the power amplifier, wherein the digital signal processor further comprises an input port for receiving the detected current and voltage, and wherein the current detector and voltage detector are operatively connected to the power amplifier and the digital signal processor, and wherein the digital signal processor calculates the amount of power supplied to the load by the power amplifier based on the detected voltage and the detected current.

* * * * *